(12) United States Patent
Wegmann et al.

(10) Patent No.: US 7,019,824 B2
(45) Date of Patent: Mar. 28, 2006

(54) MOIRE METHOD AND MEASURING SYSTEM FOR MEASURING THE DISTORTION OF AN OPTICAL IMAGING SYSTEM

(75) Inventors: Ulrich Wegmann, Koenigsbronn (DE); Uwe Schellhorn, Aalen (DE); Ralph Klaesges, Aalen (DE); Joachim Stuehler, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/935,320

(22) Filed: Sep. 8, 2004

(65) Prior Publication Data

US 2005/0122506 A1 Jun. 9, 2005

Related U.S. Application Data

(63) Continuation of application No. PCT/EP03/02283, filed on Mar. 6, 2003.

(60) Provisional application No. 60/362,552, filed on Mar. 8, 2002.

(51) Int. Cl.
*G01B 9/00* (2006.01)

(52) U.S. Cl. ..................................... 356/124

(58) Field of Classification Search ........ 356/124–127, 356/615, 618, 605
See application file for complete search history.

(56) References Cited

U.S. PATENT DOCUMENTS 1,590,532 A * 6/1926 Lenouvel ................. 356/239.1
4,386,849 A    6/1983 Häeusler et al.

(Continued)

FOREIGN PATENT DOCUMENTS

EP    0 418 054 B1    3/1991

OTHER PUBLICATIONS

J. Schwider et al, "Digital wave-front measuring interferometry: some systematic error sources," Applied Optics, Nov. 1, 1983, pp. 3421-3432, vol. 22, No. 21.

(Continued)

*Primary Examiner*—Hoa Q. Pham
(74) *Attorney, Agent, or Firm*—Sughrue Mion, PLLC

(57) ABSTRACT

In the case of a method and a measuring system for measuring the distortion of an optical imaging system with the aid of moiré patterns, an object grating with an object pattern is arranged in the object plane of the imaging system, and an image grating with an image pattern is arranged in the image plane of the imaging system. Both the object pattern and the image pattern in each case have a multiplicity of cells with sub-gratings of different grating properties, it being possible, in particular, for the sub-gratings to have different directions of periodicity and different phase angles. The object pattern and the image pattern are coordinated with one another in such a way that, when the object pattern is projected onto the image pattern with the aid of the imaging system, images of the sub-gratings of the object pattern superimpose in each case with assigned sub-gratings of the image pattern, accompanied by the generation of moiré sub-patterns, which are likewise present in the form of cells situated next to one another. As a result, it is possible simultaneously to determine distortion components for a plurality of image directions aligned transverse to one another. It is preferred to use phase-shift methods in order to evaluate the moiré sub-pattern.

33 Claims, 10 Drawing Sheets

U.S. PATENT DOCUMENTS

| | | | |
|---|---|---|---|
| 5,062,705 A * | 11/1991 | Sato et al. | 356/124 |
| 5,621,497 A | 4/1997 | Terasawa et al. | |
| 5,759,744 A | 6/1998 | Brueck et al. | |
| 5,767,959 A | 6/1998 | Kobayashi | |
| 5,834,767 A | 11/1998 | Hasegawa et al. | |
| 5,973,773 A | 10/1999 | Kobayashi | |
| 6,236,488 B1 | 5/2001 | Shimizu et al. | |
| 6,717,661 B1 * | 4/2004 | Bernstein et al. | 356/121 |
| 6,816,247 B1 * | 11/2004 | Heppner et al. | 356/124 |
| 2002/0033936 A1 | 3/2002 | Shiraishi | |
| 2002/0080365 A1 | 6/2002 | Monshouwer et al. | |

OTHER PUBLICATIONS

K. Hibino et al., "Phase-shifting algorithms for nonlinear and spatially nonuniform phase shifts," J. Opt. Soc. Am. A, Apr. 1997, pp. 918-930, vol. 14, No. 4.

J. Schmidt et al., "Window function influence on phase error in phase-shifting algorithms," Applied Optics, Oct. 1, 1996, pp. 5642-5649, vol. 35, No. 28.

* cited by examiner (a)

(b)

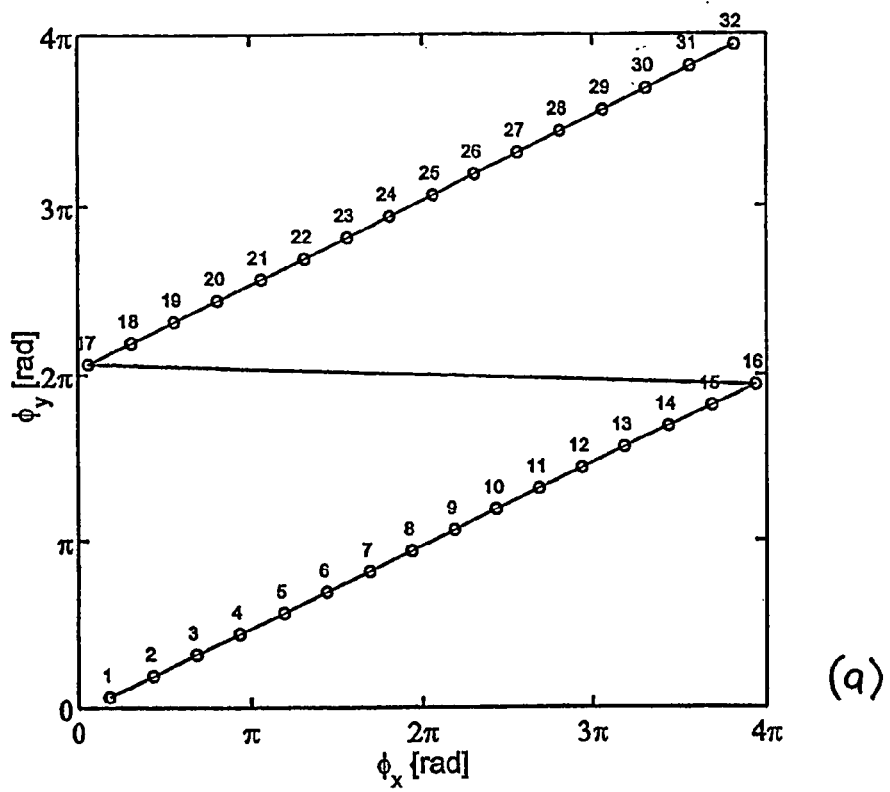
(a)
Fig. 7
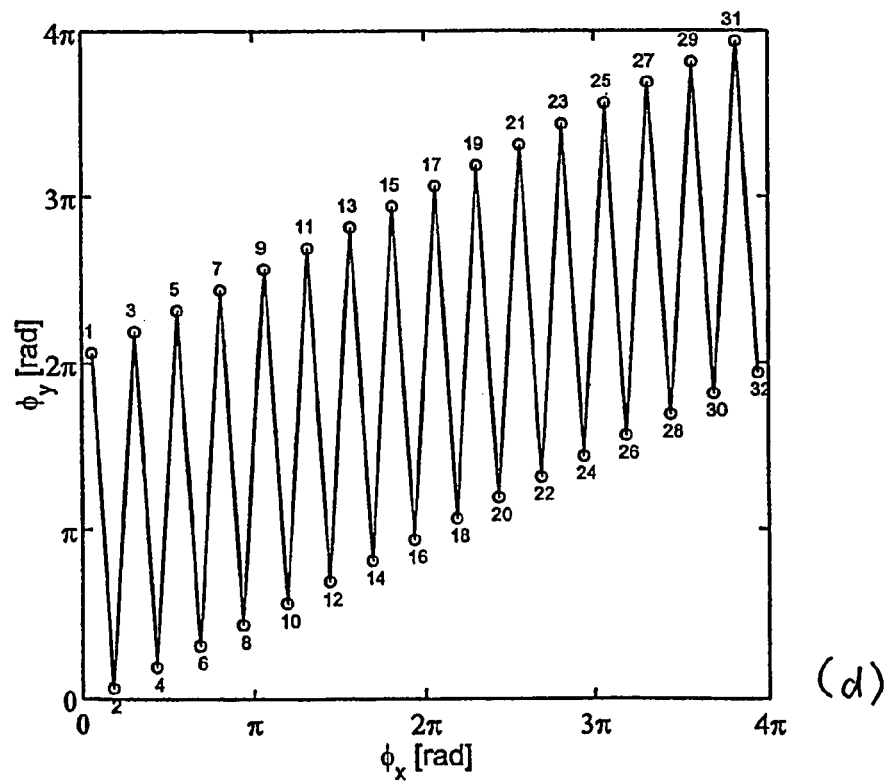
(d)

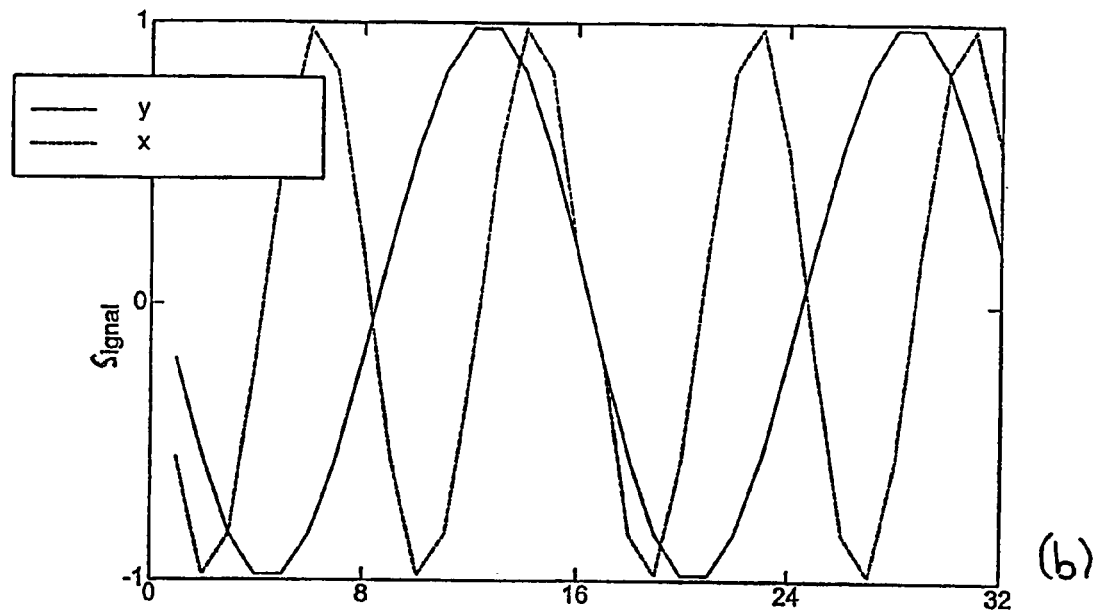
(b)
Step
Fig. 7
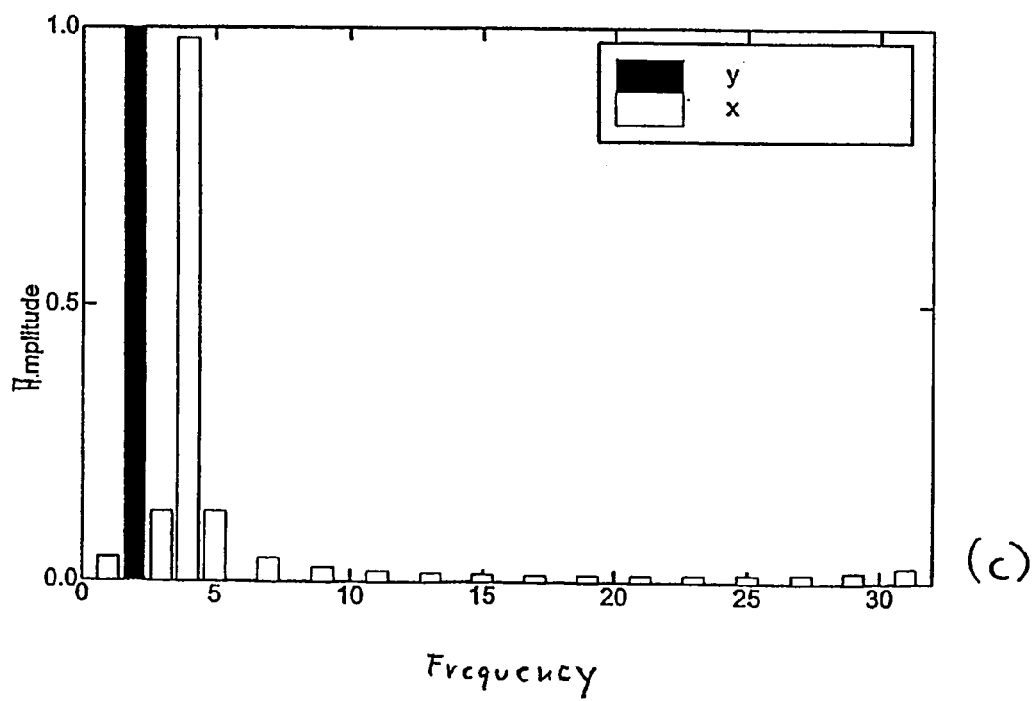
(c)
Frequency

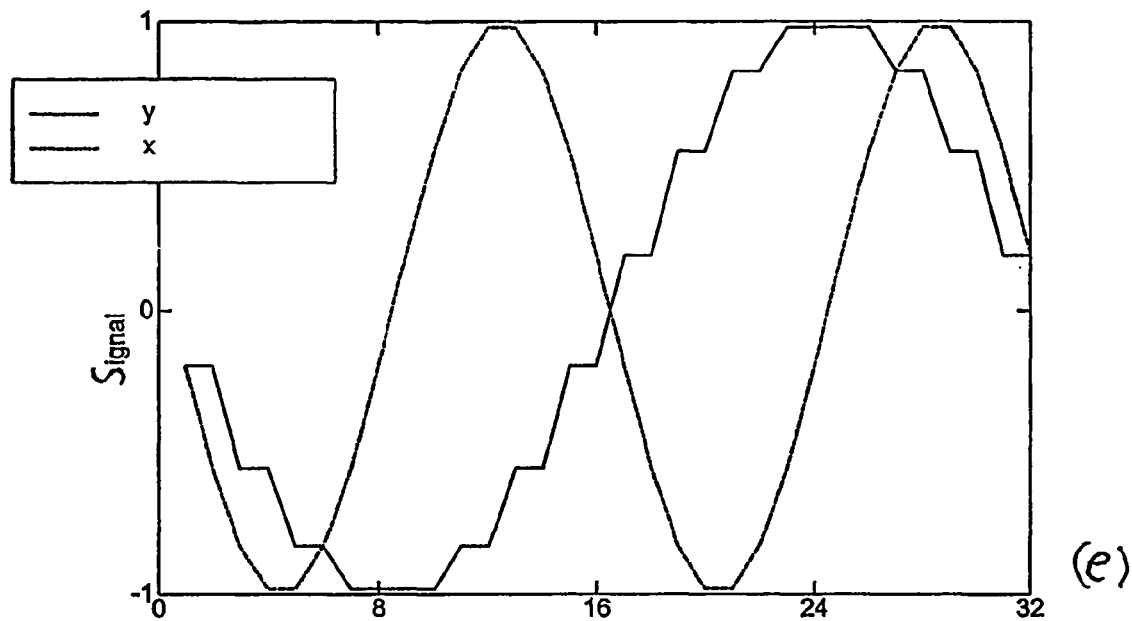
(e)
step
Fig 7
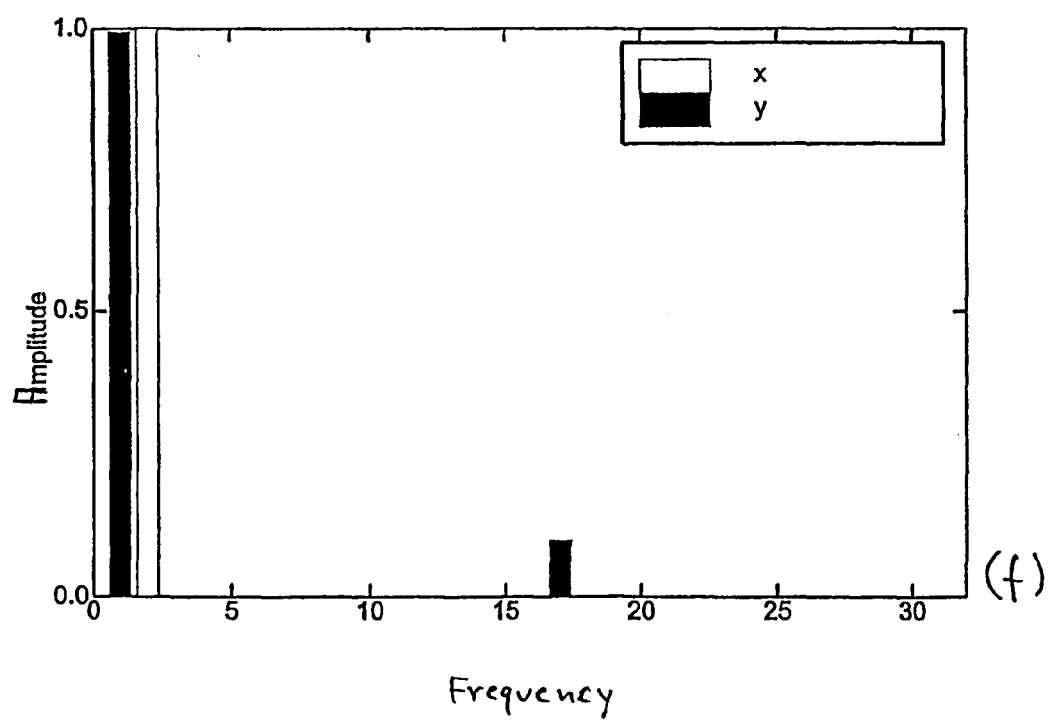
(f)
Frequency

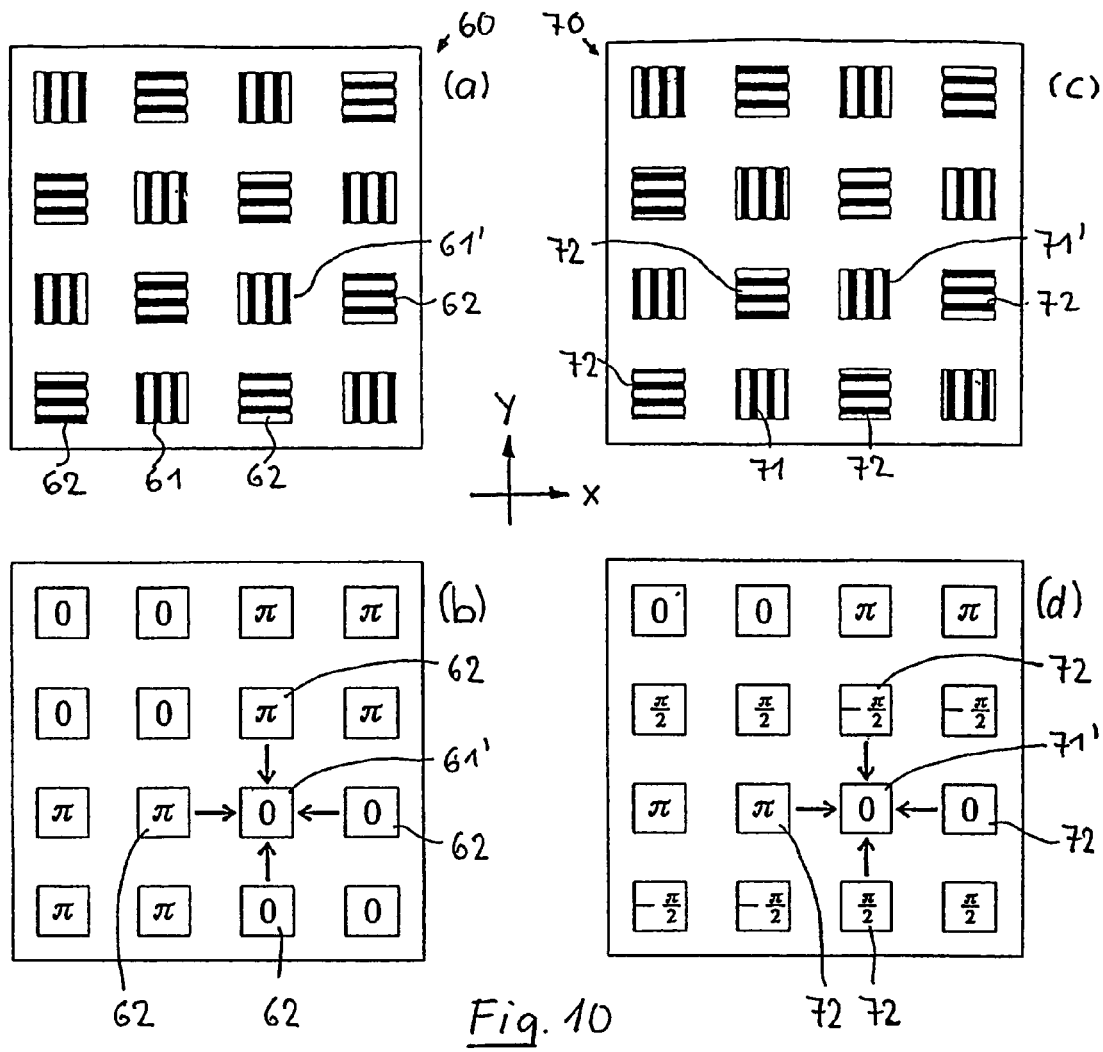
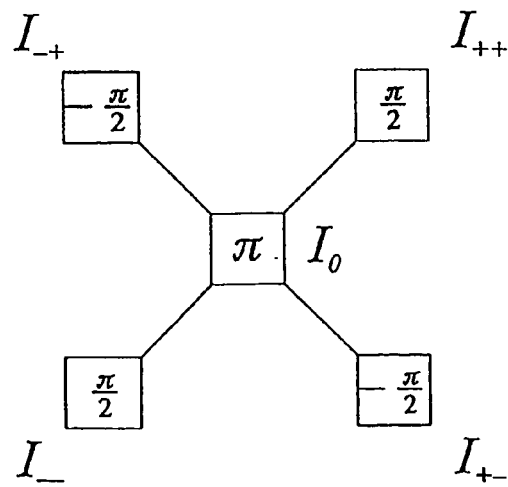
Fig. 10
Fig. 11

MOIRE METHOD AND MEASURING SYSTEM FOR MEASURING THE DISTORTION OF AN OPTICAL IMAGING SYSTEM

The present application is a Continuation of International Application PCT/EP03/02283, with an international filing date of Mar. 6, 2003, which was published under PCT Article 21(2) in English, and the disclosure of which is incorporated into this application by reference; the present application further claims priority to U.S. Provisional Application No. 60/362,552, filed on Mar. 8, 2002.

BACKGROUND OF THE INVENTION

1. Field of the Invention

The invention relates to a moiré method for measuring aberrations, particularly the distortion of an optical imaging system, and to a measuring system suitable for carrying out the method.

2. Description of the Related Art

In many fields of technology and research, use is made of optical imaging systems on which ever higher demands are being places as regards imaging quality. An example is the photolithographic production of semiconductor components and other finely structured components in the case of which structures in the submicrometer region can be produced with the aid of high-power projection objectives. An imaging optical with impermissibly high distortion can, for example, produce defects in integrated circuits, and this reduces the product yield in the case of semiconductor fabrication, thereby raising the production costs. Such projection objectives have a complicated optical design with a multiplicity of imperfect lenses, which renders it impossible as a rule for all the optical properties to be derived from theoretical calculations.

Consequently, the optical properties of an imaging system must be reliably measured. Even more onerous demands on the accuracy of the test methods used to test optical imaging systems correspond to the high demands placed on the imaging accuracy of these systems. In particular, a highly accurate measurement of distortion is mandatory.

Numerous test methods for measuring the distortion of optical systems are based on the utilization of the moiré effect. Thus, for example, for the purpose of determining the objective distortion in an image direction of a two-dimensional image field, it is known to evaluate moiré patterns which are generated with the aid of linear gratings. Arranged in this case in the object plane of the imaging system to be tested is, for example, a so-called object grating which has a transparent carrier which bears a multiplicity of parallel, nontransparent lines which form an object pattern. Arranged in the image plane of the objective is an image grating with an image pattern resembling the object pattern. The gratings are arranged perpendicular to the optical axis of the imaging system. The object pattern and the image pattern are adapted to one another in such a way that a moiré pattern with moiré fringes is produced when the object pattern is projected onto the image pattern with the aid of the imaging system.

The generation of a moiré pattern can be achieved by arranging for the ratio of the grating constants of the image grating and object grating to correspond exactly to the prescribed reproduction ratio of the objective. If one grating is rotated about the optical axis in relation to the other grating, the result is a moiré pattern composed of bright and dark fringes which run approximately perpendicular to the grating lines of the object and image gratings. The number of the fringe pairs is equal to the number of the grating lines of one grating which are crossed by a grating line of the other grating. A moiré pattern can also be generated by arranging for the grating constants of the object grating and image grating to differ slightly, for example by a few percent, taking account of the reproduction ratio. Moiré methods of this type are described, for example, in U.S. Pat. No. 5,767,959 or U.S. Pat. No. 5,973,773, which is largely identical in content.

The distortion of the objective, which is typically small by comparison with the grating constant of the image grating, can be determined, for example, by phase shifting. In this case, various moiré patterns with gratings which are in each case displaced relative to one another perpendicular to the grating lines by a fraction of the grating period are successively recorded by a camera. A periodic intensity profile is observed at each image location during the phase shifting. The relative phase of this signal at the various measuring sites is a measure of the objective distortion perpendicular to the grating lines.

The said methods can be used to determine the distortion in a single image direction perpendicular to the optical axis, specifically in the direction perpendicular to the grating lines. If it is intended to determine distortion components in other image directions, it is customary to turn the objective axially, for example by 90°, before a further measurement. A mechanically complicated measurement setup is required for this purpose.

EP 0 418 054 describes a moiré method which, in two successive steps, permits firstly the determination of the distortion components in an image direction, and thereafter the determination of the distortion components in an image direction perpendicular thereto. For this purpose, it is provided in the case of one embodiment that the object grating bears a two-dimensional object pattern in the form of a crossed grating. The image pattern is, by contrast, a one-dimensional one with a set of parallel lines. Furthermore, there is provided in the projection objective to be measured a displaceable pupil filter with the aid of which the diffractive reflections of first order in the X direction or Y direction can optionally be passed, and the remaining reflections can optionally be cut out. In order to alternate between the measuring directions, the pupil filter is displaced, on the one hand, and the image grating is rotated by 90°, on the other hand. Thus, in the case of this system, it is possible to dispense with the rotation of the objective. However, it is necessary to intervene in the projection objective in order to install a suitable pupil filter, and the holder for the image grating needs a complicated design which must permit the image grating to rotate by 90°.

SUMMARY OF THE INVENTION

It is one object of the invention to provide a moiré method and a corresponding measuring system with the aid of which it is possible to measure distortion in a plurality of different image directions quickly and with high measuring accuracy.

As a solution to this and other objects, this invention, according to one formulation, provides a moiré method for measuring aberrations of an optical imaging system, comprising:

arranging an object grating with an object pattern in an object plane of the imaging system;

arranging an image grating with an image pattern in the image plane of the imaging system;

the object pattern and the image pattern in each case having a multiplicity of cells with sub-gratings of different grating properties; and the object pattern and the image pattern being adapted to one another in such a way that, when the object pattern is projected onto the image pattern with the aid of the imaging system, images of the sub-gratings of the object pattern superimpose, at least partially, in each case with assigned sub-gratings of the image pattern, accompanied by the generation of moiré sub-patterns;

detecting the moiré sub-patterns; and evaluating the moiré sub-patterns.

In this case, the evaluation comprises, in particular, determining a first distortion component and at least one second distortion component from the moiré sub-patterns, the first distortion component being assigned to a first image direction of the image plane, and the second distortion component being assigned to a second image direction, running transverse to the first image direction, of the image plane.

A corresponding measuring system for measuring the distortion and/or aberrations of an optical imaging system with the aid of moiré patterns comprises:

an object grating, which can be arranged in the object plane of the imaging system, with an object pattern which has a multiplicity of cells with sub-gratings of different grating properties;

an image grating, which can be arranged in an image plane of the imaging system, with an image pattern which has a multiplicity of cells with sub-gratings of different grating properties;

the object pattern and the image pattern being adapted to one another in such a way that, when the object pattern is projected onto the image pattern with the aid of the imaging system, images of the sub-gratings of the object pattern superimpose, at least partially, in each case with assigned sub-gratings of the image pattern, accompanied by the generation of moiré sub-patterns;

devices for projecting the object pattern onto the image pattern in order to generate the moiré sub-patterns;

devices for detecting the moiré sub-patterns; and devices for evaluating the moiré sub-patterns.

A preferred design provides that the object grating is irradiated with the aid of an illuminating device, and the radiation modified by the object pattern is projected sharply onto the image grating by the imaging system. Depending on the application, suitable gratings can be formed, for example, as transmission gratings, phase gratings or reflection gratings. A "grating" according to this application is a grating like pattern having typical dimensions which are large compared to the wavelength of the used radiation. Therefore, gratings are typically not diffraction gratings. A preferred device for detecting the multiplicity of linear moiré sub-patterns can comprise a two-dimensional detector, for example with a CCD chip, with the aid of which the superimpositon of imaged object pattern and image pattern is detected. An image-forming optics is preferably present between the image grating and the detector, but it can also be omitted.

In the case of a preferred measuring system, the object grating and the image grating have a multiplicity of cells or patches whose sub-gratings are in each case line gratings with alternately different grating orientations which alternate between directly neighboring cells. The grating orientations can be described by the grating vectors running perpendicular to the grating lines, or directions of periodicity. Such nested sub-gratings are denoted here as parquet gratings, and the cells are denoted correspondingly as parquet cells. There may be two or more different directions of periodicity. A preferred basic pattern with two directions of periodicity consist of cells which are arranged in squares, fill the surface in the manner of a chessboard, and are filled with line gratings oriented alternately perpendicular to one another. Also possible are gratings with, for example, three, four or six different directions of periodicity between which, for example, angles of 120, 90 or 60° can lie.

The sub-gratings of the individual parquet cells can also have different grating constants. Thus, for example, it is possible, during the distortion measurement, to scan a larger portion of the pupil, because small structures, that is to say structures with small grating constants, correspond to a larger spatial frequency.

The moiré sub-patterns, generated by superposition of assigned sub-patterns, in the region of the image plane are present in the form of a parquet with cells situated next to one another. Moiré fringes or parts of moiré fringes with different orientations can be situated in neighboring cells. It is also possible for one moiré fringe to be distributed over a plurality of neighboring cells such that no fringe can be detected within a cell, and the cells are largely homogeneously illuminated. Such a parquet of moiré patterns bears, for example, the distortion information of at least two image directions running transverse to one another. This singlewave of prior-wave distortion information can be derived in the case of methods according to the invention from a single measurement or measurement series, if appropriate simultaneously for a plurality of image directions, without it being necessary for this purpose to exchange the object grating and/or the image grating, or to rotate the imaging objective to be measured.

The distortion is the optical characteristic of an imaging system which can preferably be determined with the aid of measuring systems according to the invention. However, it is also possible for other optical characteristics to be derived from the moiré sub-patterns, for example coma, image shape, astigmatism, contrast, scattered light or the like. It is possible to provide a displacement in the axial direction in order to facilitate the evaluation in the case of coma and the measurement of imaging surface and astigmatism.

There are various possibilities for evaluating the information contained in a moiré pattern. For example, a plurality of moiré fringes can be generated within a cell and these can be evaluated spatially, for example by scanning transverse to the fringe direction. It is also possible to evaluate a fringe shift directly. It is preferred to use a phase shift. In this case, there is a displacement of the object pattern and image pattern relative to one another in at least one displacement direction, running parallel to the object plane or image plane of the imaging system, in order to generate moiré sub-patterns with different phase angles and detecting locally the intensity of the moiré sub-patterns at at least one image location of the moiré sub-patterns in order to determine a temporally alternating phase shift signal assigned to the image location, which is preferably an intensity signal. The gratings can be shifted relative to one another in small steps or continuously such that migrating moiré sub-patterns result. These produce, for example, at each image location of a detector picking up the moiré pattern a substantially periodic intensity profile which can be, for example, substantially sinusoidal. The initial phase of the periodic signal contains the information for calculating the distortion in the direction of a grating-specific displacement direction which corresponds to the direction of periodicity of the superimposed sub-gratings. Other optical characteristics in the displacement direction can be derived from the amplitude. For example, the contrast can be determined from the amplitude of the periodic intensity profile. The astigmatism can be determined from the Z difference of the best contrast between various directions of orientation. Scattered light can be determined from the intensity in parquet gaps.

Inventive measuring systems permit distortion components of at least two different image directions to be determined simultaneously in a simple way in the course of a measurement. It can be provided for this purpose that the object pattern and the image pattern in each case have a group of first cells with first sub-gratings of a first direction of periodicity and at least one group of second cells with second sub-gratings of a second direction of periodicity, which runs transverse to the first direction of periodicity,; and the relative displacement is carried out in a displacement direction which runs transverse to the first and to the second direction of periodicity, and therefore does not coincide with any of the directions of periodicity. Consequently, a shift simultaneously effects corresponding displacement components in the first and in the second direction of periodicity which are specific to the sub-gratings, such that displacement and measurement can be carried out simultaneously in a plurality of image directions running at angles to one another.

For example, the displacement can be carried out in the direction of an angle bisector between the first and second directions of periodocity, and this corresponds to a diagonal direction in the case of mutually perpendicular directions of periodicity. However, it is preferred to perform relative displacement in a displacement direction which is not situated symmetrically between directions of periodicity. Different periodicity lengths of the phase shift signals assigned to the image directions result in this case in the directions of periodicity, particularly given identical grating constants. As a result, crosstalk between the various directional components is suppressed to such an extent that it is possible to achieve high measuring accuracy.

The relative displacement in a displacement direction situated asymmetrically between directions of periodicity can also be advantageous in the case of other multidimensional object/image patterns which are not parceled, for example when using object/image patterns with an (orthogonal or oblique-angled) crossedygrating, or an orthogonal or oblique-angled chessboard grating.

It is also possible for a relative displacement to be carried out in a temporally offset fashion in a first displacement direction assigned to the first direction of periodicity, and in a second displacement direction assigned to the second direction of periodicity. In particular, a complete signal can firstly be picked up in one displacement direction, and thereafter a complete signal can be picked up in the second displacement direction. It is also possible to alternate multiply between the displacement directions. It is possible for predetermined relative positions between the object pattern and image pattern in the first displacement direction and the second displacement direction to be set in different sequences in order in this way to obtain permutation of relative positions. Crosstalk between signals for different image directions can also be avoided thereby.

If the number of the grating periods swept over during a relative displacement differs for the various directions of periodicity, signals affected by crosstalk can be separated by Fourier transformation. A preferred evaluation method correspondingly provides a Fourier transformation of the phase shift signal assigned to an image location, in order to determine a frequency spectrum for a first and at least one second direction of periodicity, and separating the frequency spectra of the directions of periodicity in Fourier space. Frequencies produced by crosstalk can thereby be removed. An evaluation in the frequency domain is preferred. It is also possible to evaluate after a back transformation in the spatial domain. In each case, the determination of the initial phase can be carried out for the various directions of periodicity without impairment by interfering signals, this being done on the basis of the phase shift signals purged by removing crosstalk signals.

It has been found that the individual "parquet cells" influence one another less the further they are removed from one another. In order to reduce crosstalk between different directions of periodicity, it is provided in preferred embodiments that a lateral spacing exists between regions of the cells which are used. This can be achieved, for example, by virtue of the fact that in the case of cells directly adjacent to one another, only the middle region in the cells is respectively evaluated and the grating structure in the edge region is dispensed with. The crosstalk distance is thereby increased without the spatial resolution of the cell suffering thereby.

It is also possible to fashion the object pattern and/or the image pattern such that a lateral spacing or a grid-free gap exists between neighboring cells. The cells are thus not arranged to fill the surface, but with a spacing between the individual sub-grating regions. A further advantage of gaps results from the fact that structures for other measuring techniques, for example for measuring techniques for image quality or for scattered light, can be introduced into the interspaces between the cells.

In a regular grating, in the case of which the sub-gratings of identical directions of periodicity form an unbroken continuation without a phase shift, crosstalk of a plurality of parquet cells can arise in a single cell. In order to avoid this, preferred gratings are fashioned such that the sub-gratings of cells of identical direction of periodicity and of equivalent symmetry are phase-shifted relative to one another, and therefore have different initial phases. This can apply to directly neighboring, close neighbors and to more remote neighboring cells. This measure is particularly effective when the phase angles of the sub-gratings and of the sub-gratings of cells of equivalent symmetry thereto are adapted to one another in such a way that, modulated signals of the equivalent cells compensate one another at least partially. Examples of such object gratings and image gratings with a phase shift of $\pi$ and multiples of $\pi/2$ for the purpose of compensating crosstalking fundamental waves, or of fundamental waves and first harmonics are explained in more detail in conjunction with the exemplary embodiments.

Without further processing, the information-bearing superimposition pattern consisting of a multiplicity of moiré sub-patterns can be interpreted as a rule only with difficulty. In order to permit a visual assessment of the moiré pattern, it is provided in a preferred variant to carry out an interpolation of an overall moiré pattern of at least one image direction from moiré sub-patterns of identical grating orientation of the cells, and to display optically the calculated overall moiré pattern. It is possible in this way to reconstruct for each direction of periodicity a moiré pattern of a linear grating to which an operator is accustomed. The reconstruction can be performed separately for each direction of periodicity. The reconstructed overall moiré patterns can be displayed one after another or, if desired, simultaneously.

In addition to emerging from the claims, the above and further features also follow from the description and the drawings, it being possible for the individual features to be

BRIEF DESCRIPTION OF THE DRAWINGS

FIGS. 7(a)–(f) show diagrams for explaining the setting of different relative positions of object and image gratings in accordance with various phase timetables ((a) and (d)), signal intensity profiles ((b) and (e)) resulting therefrom, and Fourier spectra ((c) and (f)) resulting from the phase shifts;

FIG. 10 shows exemplary embodiments for parquet gratings with varying initial phases, (a) showing the offset position of grating lines for a π grating, (b) showing the distribution of the initial phases of the π grating, (c) showing the offset position of grating lines of a π/2 grating, and (d) showing the distribution of the initial phases in the case of a π/2 grating;

FIG. 11 shows a schematic for explaining an interpolation of the intensity in a parquet cell.

DETAILED DESCRIPTION OF THE PREFERRED EMBODIMENTS

The invention is explained below with the aid of distortion measurement in the case of a microlithographic projection objective, but can also be used to measure other optical imaging systems, for example photographic objectives or the like, and to measure other imaging properties, for example contrast, astigmatism, image shape etc.

Figure 1:
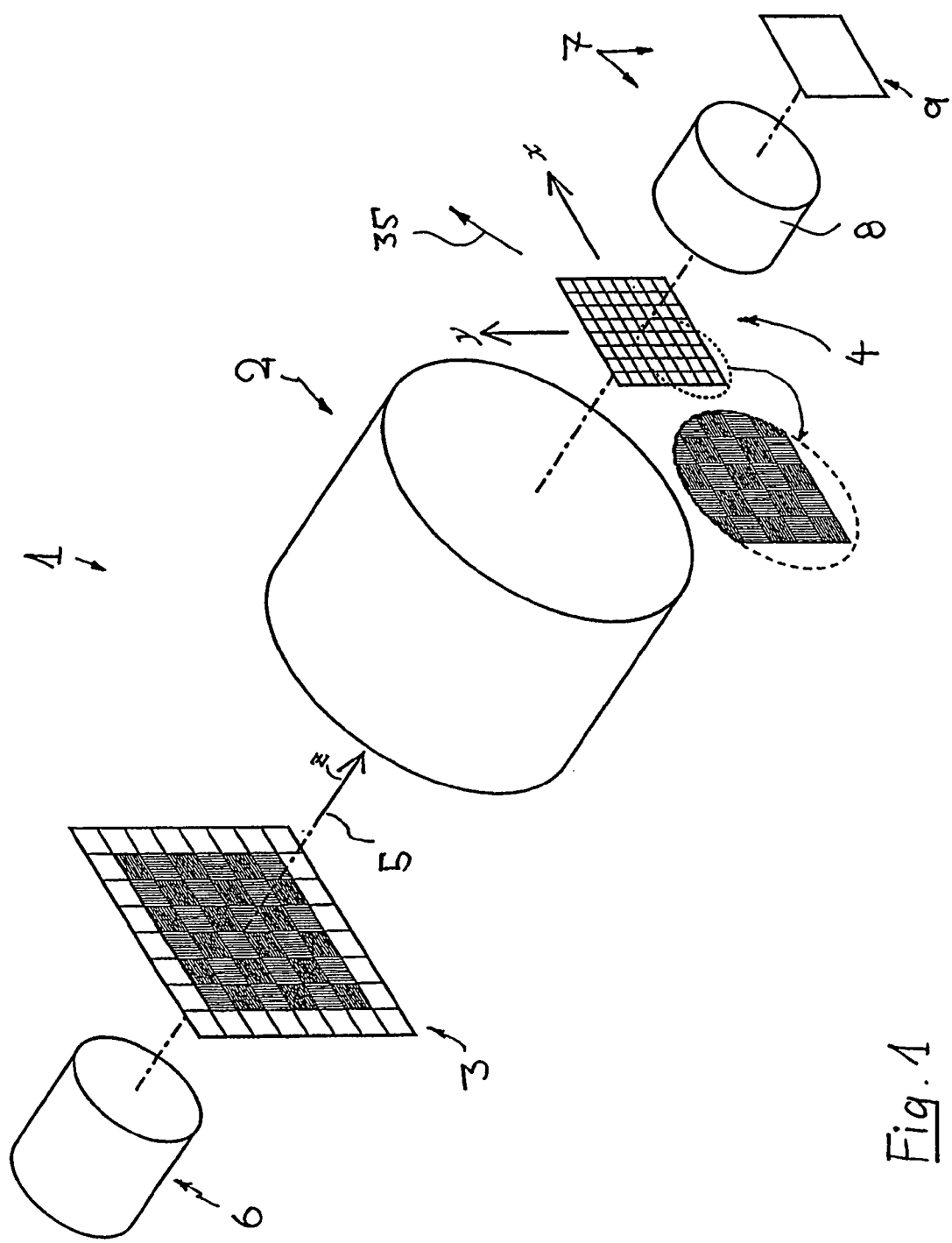
FIG. 1 shows a schematic perspective view of an embodiment of an inventive measuring system for measuring the distortion of a projection objective.

The distortion measuring system 1, shown in FIG. 1, for measuring the distortion of a projection objective 2 comprises an object grating 3, arranged in the object plane of a projection objective 2, and an image grating 4 arranged in the image plane of the projection objective that is conjugate with the object plane. The transmission gratings 3 and 4 are each arranged perpendicular to the optical axis 5 of the measuring system (z-axis), which is to be aligned parallel to the optical axis of the objective 2 and coincides in the example shown with this optical axis. The image grating 4 is held displaceably in the x-y plane lying perpendicular to the optical axis, a manipulator device (not shown) being provided that comprises a displacement device operating in two dimensions. Suitable displacement devices can be arranged in addition or as an alternative to the object grating 3. A schematically illustrated lighting unit 6 is arranged on the side of the measuring system averted from the projection objective. Located on the side of the image grating 4 averted from the projection objective 2 is a device 7 for detecting a moiré pattern generated in the image plane, the device 7 comprising in the example shown an imaging optics 8 and a two-dimensional detector 9 that has a CCD chip as sensor surface. A controller (not shown) of the measuring system comprises devices for displacing the image grating 4 in the x-y plane, and an image evaluation device, connected to the detection device 7, having an evaluation program that is suitable for image processing and whose mode of operation is explained in more detail further below.

When the object grating 3 is lit with the aid of the lighting unit 6, the object pattern is projected by means of the projection optics 2 onto the image pattern arranged in the image plane thereof, and superimposed therewith in this way to form a moiré pattern. This superimposition is projected with the aid of the imaging optics 7 onto the detector 9 and is thereby accessible for image evaluation. There is no need for the object grating image to have identical dimensions to the assigned image grating. It can be advantageous, for example for reasons of adjustment, if the imaged object parquet cells are of larger area than the image parquet cells and project over the latter on all sides. Partial superimposition can suffice.

Figure 2:
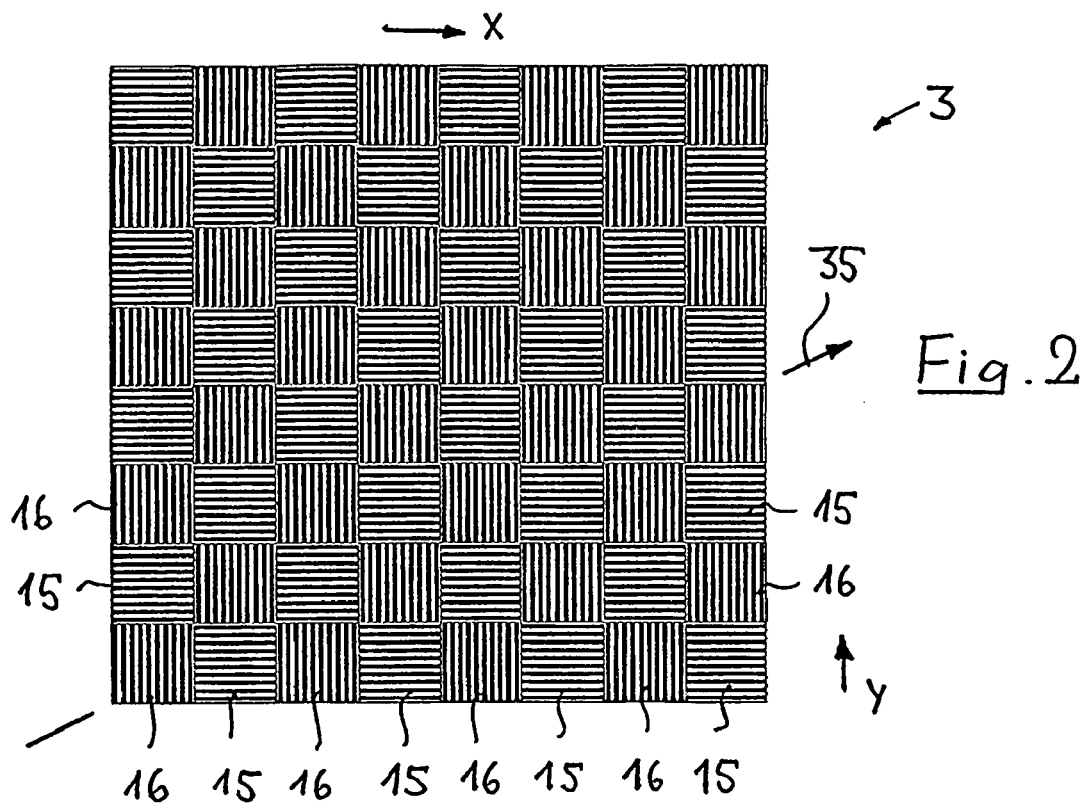
FIG. 2 shows an exemplary embodiment of an orthogonal parquet grating with two orthogonal directions of periodicity.

A detail of a preferred embodiment of an object grating 3 is shown in FIG. 2. The object grating 3 bears an object pattern that is subdivided into a multiplicity of square cells 15, 16 that each have linear sub-ratings with different directions of periodicity and adjoin one another directly in the fashion of a parquet. The lines are equidistant and parallel within each cell, the direction perpendicular to the lines specifying the assigned direction of periodicity, which coincides with the grating vector. The lines of directly neighboring cells 15, 16 in the x direction and y direction are arranged orthogonal to one another. Such gratings, which are constructed from cells with sub-gratings of different grating properties, in particular different structure orientation, are denoted here as "parquet gratings".

In the example, the object grating consists of a transparent carrier, for example a quartz plate, with applied, nontransparent lines, for example made from chromium. Phase or reflection gratings also come in consideration in addition to transmission gratings.

The image grating 4 constructed in an analogous way, likewise bears an orthogonal parquet grating with two structure orientations, it being possible for the ratio of the grating constants of the sub-gratings of the object grating to the image grating to correspond to the reproduction ratio of the projection objective 2. Object grating and image grating are adapted to one another in such a way that, when the object pattern is projected onto the image pattern with the aid of the imaging system 2, images of the sub-gratings 15, 16 of the object pattern superimpose in each case with assigned sub-gratings, with identical structural direction, of the image pattern, accompanied by the generation of moiré sub-patterns. These moiré sub-patterns are likewise arranged in the form of juxtaposed cells in a fashion corresponding to the cells of object and image gratings, and form a parqueted moiré pattern.

The generation of moiré patterns can be achieved by virtue of the fact that the ratio of the grating constants of object grating and image grating does not correspond exactly to the reproduction ratio of the projection objective, but deviates a few percent therefrom, for example. Alternatively or in addition, it is also possible to generate moiré patterns by virtue of the fact that one of the gratings, for example the image grating 4, is rotated about the z axis with reference to the other grating 3. A suitable rotation device for the image grating and/or object grating can be provided for this purpose. It is favorable to use a relative rotation for the adjustment to align the grating lines substantially parallel with one another during measurement so as to produce moiré fringes of very large width, ideally infinitely large width.

Figure 3:
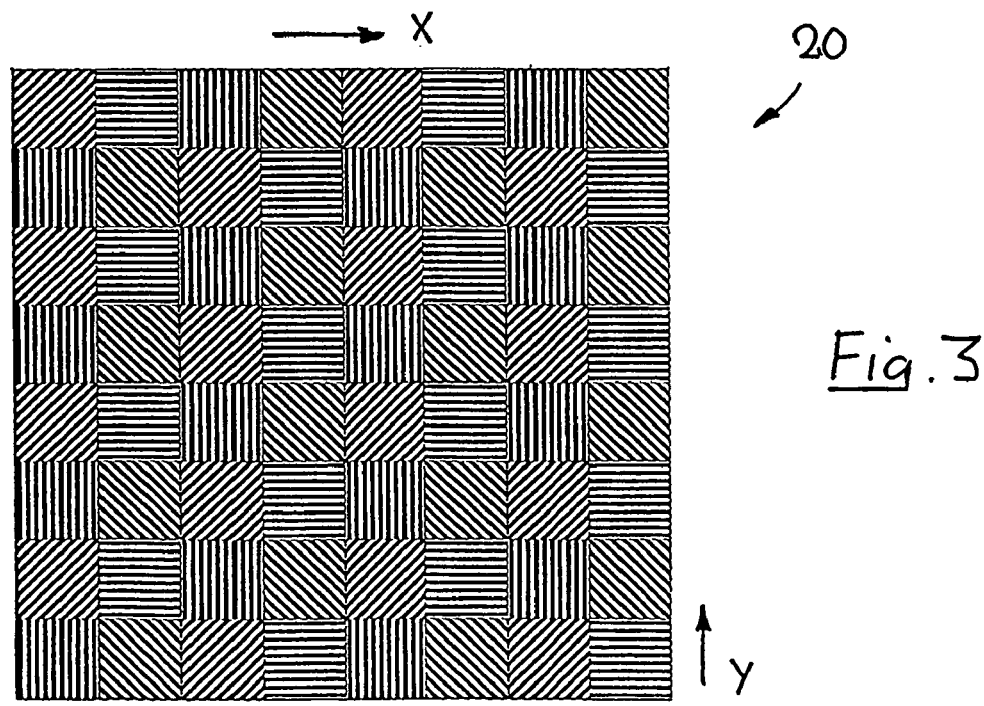
FIG. 3 shows an exemplary embodiment of an orthogonal parquet grating with four directions of periodicity.
Figure 4:
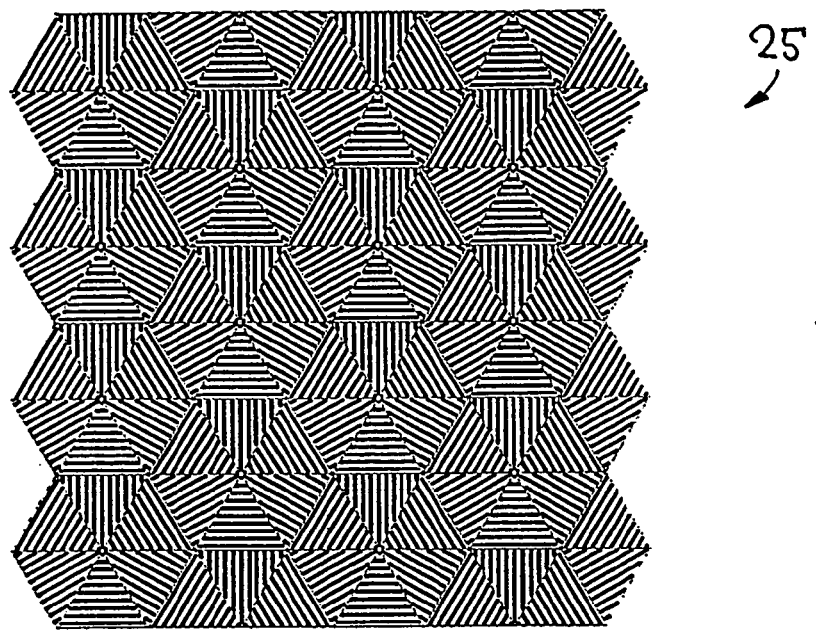
FIG. 4 shows an exemplary embodiment of a trigonal parquet grating with six directions of periodicity.
Figure 5:
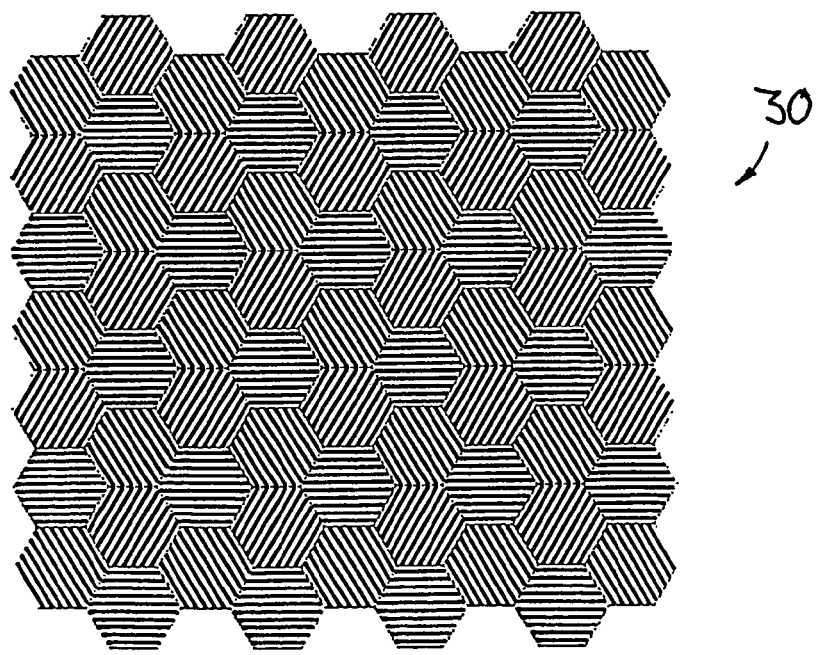
FIG. 5 shows an exemplary embodiment of an hexagonal parquet grating with three directions of periodicity.

In the square grating in accordance with FIG. 2, two structure orientations or directions of periodicity, which are perpendicular to one another, occur. Other arrangements and structural directions are also possible for specific measuring tasks. As an example, FIG. 3 shows the embodiment of an orthogonal parquet grating 20 with square cells and four structural orientations, the directions of periodicity of neighboring cells being rotated in each case by 45° or a multiple thereof about a direction running perpendicular to the grating plane. The parquet grating 25 in FIG. 4 is constructed as a trigonal parquet grating with six structural directions. The individual cells have the form of equilateral triangles which fill the structured surface without gaps. The overall structure is constructed such that in each case six cells abutting at a common corner form a regular hexagon and, as regards the fields within the hexagon, neighboring sub-gratings in the clockwise direction or counterclockwise direction are rotated by 30° relative to one another in each case. FIG. 5 shows an exemplary, embodiment of an hexagonal parquet grating 30 with three directions of periodicity, which are rotated by 120° relative to one another in each case. The cells, arranged to fill the surface, are in the shape of regular hexagons, the sub-gratings of neighboring hexagonal cells being located by 60° relative to one another in each case.

Preferred gratings are therefore characterized in that in each case cells of identical shape and size and identical orientation of the sub-gratings are situated at a spacing from one another in a regular two-dimensional arrangement and form a group. Situated between the cells of an identical structural direction are cells of other structural directions which, for their part, form a group of cells of identical structural direction arranged regularly at a spacing from one another. These are preferably line gratings nested in one another and of identical grating periods.

It is preferred to use a phase shifting method in order to determine the distortion and, if appropriate, other aberrations of the objective 2. For this purpose, one of the gratings 3, 4, or both gratings, is/are simultaneously displaced relative to one another along a displacement direction running perpendicular to the optical axis. By locally detecting the intensity of the moire sub-patterns with the aid of the detector 9 in each parquet cell of the parceled moiré pattern, it is possible in this case to detect a,periodic phase shift signal that is based on the temporary alternating intensity of the radiation falling onto a portion of the detector surface. The phase of the gratings can be displaced either in discrete steps relating to predetermined relative positions, or continuously, the signal detection, for example the exposure of a camera, being synchronized with the movement in the case of continuous displacement. The initial phase of the recorded signals contains the distortion for the structure orientation assigned to respective cells.

The initial phase can be determined by using any evaluation method suitable therefor. For example, the phase angle of the signal at the zero point can be determined from a periodic signal that goes over at least one period and is sampled multiply, for example five times, within the period (Schwider method). Some methods, known to the person skilled in the art, for determining the initial phase are described in the following publications, whose contents are incorporated into this description by reference:

J. Schwider, R. Burow, K-E. Elssner, J. Grzanna, R. Spolaczyk and K. Merkel: Digital Wavefront Measuring Interferometry—Some Systematic Error Sources; Appl. Opt. 22 (1988) 3421

K. Hibino, B. F. Oreb, D. I. Farrant, K. G. Larkin: Phase-Shifting Algorithms for Nonlinear and Spatially Nonuniform Phase Shifts, J. Opt. Soc. Am. A 14 (1997) 918

J. Schmit, K. Creath: Window Function Influence on Phase Error on Phase-Shifting Algorithms, Appl. Opt. 35 (1996) 5642

Some particular advantageous variants of inventive measuring methods are explained below with the aid of an exemplary embodiment in which the object grating 3 and the image grating 4 are designed in each case as orthogonal parquet gratings with square cells and two mutually perpendicular structure orientations corresponding to the grating in accordance with FIG. 2.

The relative displacement can be carried out in principle by displacing in an alternating fashion in the various directions of periodicity (corresponding to x and y directions). However, it is preferred to displace simultaneous in both directions of periodicity that occur. This can be achieved, for example, by virtue of the fact that the displacement direction runs diagonally relative to the structural orientations, that is to say in the direction of an angle bisector between the first and the second directions of periodicity. Referring to the directions of periodicity, this means a simultaneous displacement by identical displacement lengths such that the moiré signals assigned to the directions of periodicity have a substantially identical periodicity length. This can lead to crosstalk between the signals assigned to the individual directions of periodicity, which reduces the measuring accuracy.

Consequently, it is preferred to displace in a displacement direction 35 that is situated asymmetrically between the directions of periodicity, that is to say in a direction deviating from the angle bisector. If, for example as in FIG. 2, the displacement direction 35 is situated at an angle of approximately 26.6° to the x direction and approximately 63.4° to the y direction, the relative displacement of the gratings referred to the x direction takes place twice as quickly as when referred to the y direction. If $\Lambda$ is the fundamental period or pitch, the path differences $\rho_x$ in the x direction and the $\rho_y$ in the y direction can be developed, given stepwise relative displacement with equidistant steps, in such a way, for example, that the phase steps $1*\Lambda/8$, $2*\Lambda/8$, $3*\Lambda/8$ ... etc. are traversed for $\rho_x$, while at the same time the phase steps $1*\Lambda/16$, $2*\Lambda/16$, $3*\Lambda/16$ ... are traversed for $\rho_y$. After 16 steps, a two-fold fundamental period is traversed in the x direction, and the single fundamental period is traversed in the y direction.

The ratio of the displacement lengths in the respective directions of periodicity is determined in general by the ratio of the lengths of the projections of a unit vector, running in the displacement direction 35, to the directions of periodicity of the parquet grating. It is to deviate from one and can be any rational number, for example 1:2, 1:3, 1:4, 2:3, 3:2, 4:2, or the like. This also holds mutatis mutandis for parquet gratings with more than two structure orientations or directions of periodicity, for example the grating types shown in FIGS. 3 to 5.

Figure 6:
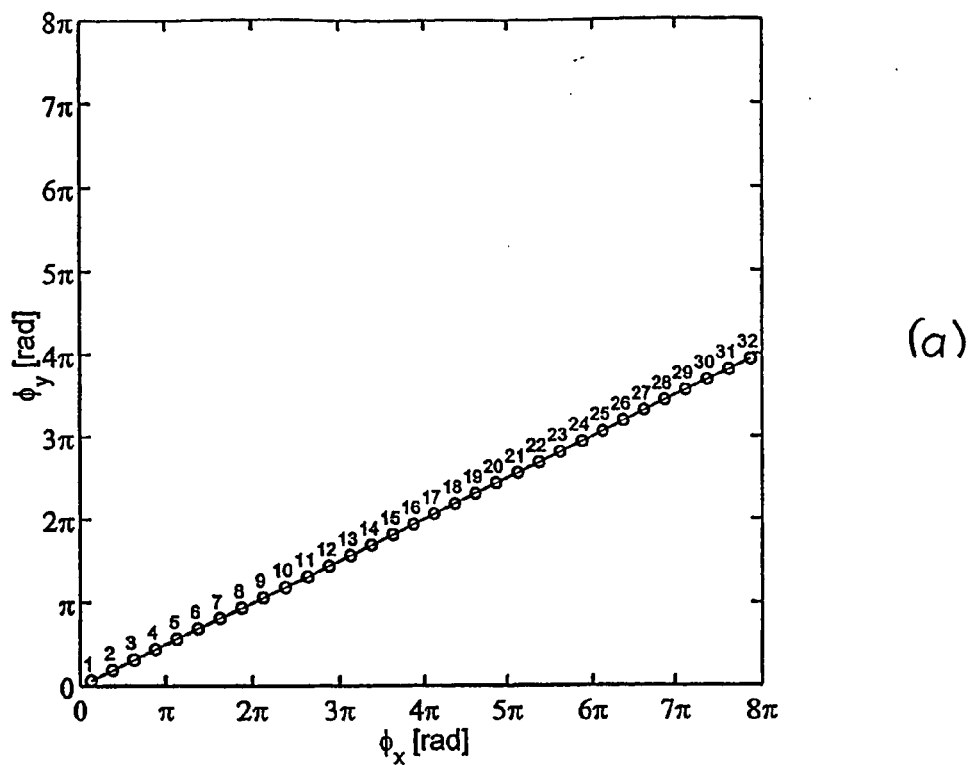
FIG. 6(a) shows a diagram,for explaining various relative positions approached by the object and image gratings in the case of nondiagonal phase shifting
FIG. 6(b) shows a schematic for explaining the frequency separation of the modulated moiré intensity effected by nondiagonal phase shifting.
Figure 6:
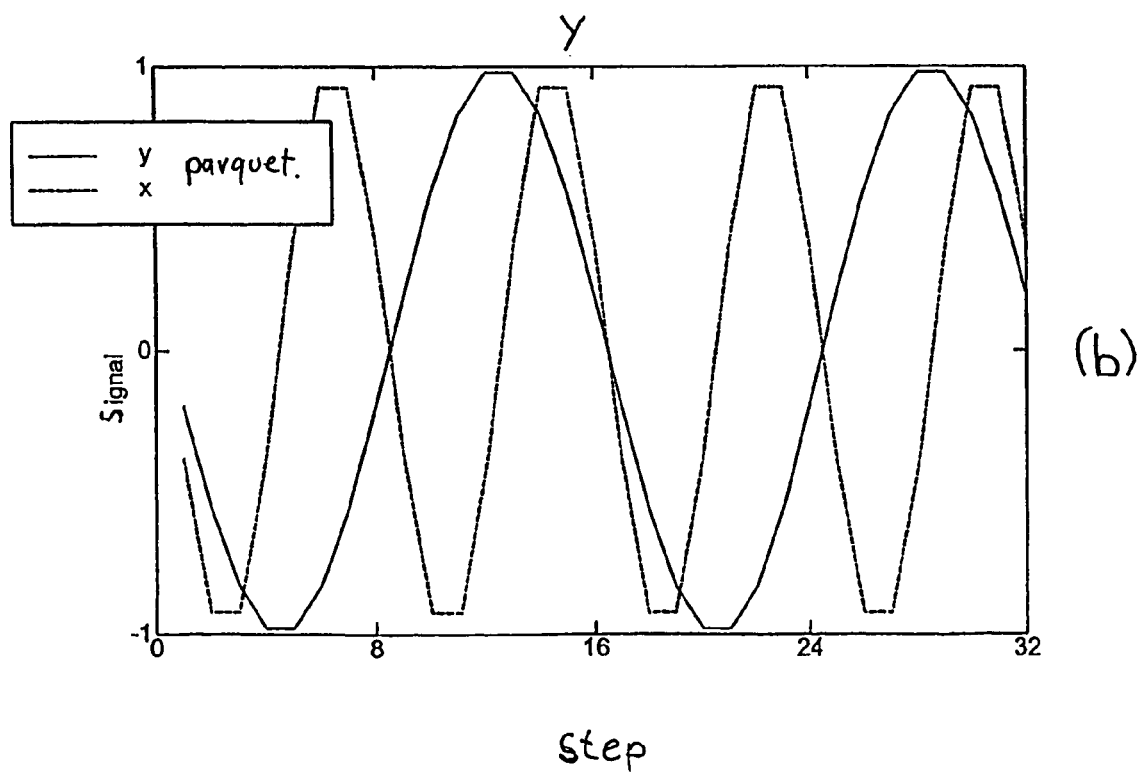

If the, ideally integral, number of the grating periods swept over during the relative displacement differs for the various structural orientations, the crosstalk signals can be separated by Fourier transformation. For the purpose of explanation, FIGS. 6(a) shows an example of a sequence of grating positions approached one after another in conjunction with nondiagonal phase shifting, in the case of which sequence displacement is twice as fast in the x direction as in the y direction. The phases for four periods (corresponding to 8 π) are respectively given in radians on the axes. FIG. 6(b) shows the frequency separation, effected by the nondiagonal displacement direction, of the modulated moiré intensity, the number of the displacement step being plotted on the abscissa, and a normalized signal intensity being plotted on the ordinate. It may be seen that the frequency for the x direction is twice as high as the frequency in the y direction. It is thereby easily possible to use Fourier transformation to separate the signals assigned to the various directions of periodicity.

Another possibility of preventing crosstalk between signals assigned to the individual directions of periodicity consists in setting the predetermined relative positions between object pattern and image pattern in different sequence in the displacement directions respectively assigned to the directions of periodicity. The frequency of crosstalk signals can likewise be shifted by comparison with the useful signal by means of the phase steps sequence permutated in this way. For the purpose of explanation, FIG. 7(a) shows a simple example for a permutated phase plan with phase shift in the y direction, in the case of which plan the steps 1, 2, 3, . . . , 16, 17, 18, 19, . . . 31, 32 are traversed, regarded in accordance with the steps 1, 2, 3 in the y direction, while the step sequence is 17, 1, 18, 2, 19, 3, . . . 15, 32, 16 in the x direction. The associated, resulting signal intensity profiles for the y and x parquets as a function of the steps are shown plotted in a normalized fashion in FIG. 7(b). It may be seen that a smooth sinusoidal function of the signal amplitude is yielded for the y direction, which is traversed in the correct sequence of the phase steps. A function of the signal amplitude that deviates from the sine follows for the x direction as a function of the phase steps. A Fourier decomposition of the signal amplitudes yield the frequencies in the Fourier space that are shown in FIG. 7(c). It may be see that only one frequency (frequency =2) is yielded for the sinusoidal function of the y direction, while the decomposition of the nonsinusoidal x signal amplitude contains a multiplicity of frequencies of different amplitude, of which, however, none is at the frequency of the y signal. It is thereby achieved that, despite an identical number of periods, the spectra of the orthogonal directions of periodicity do not overlap, and thus can be separated form one another in the frequency domain.

FIG. 7(d) shows another phase shift plan, in the case of which the phase shift is performed in the x direction. Viewed in the x direction, the steps 1, 2, 3, 4 approached one after another are situated in the correct sequence with rising phase one after another, while in the y direction phase jumps of large absolute magnitude in each case are situated between the positions approached one after another. The corresponding normalized signal intensity amplitudes in FIG. 7(e) shows correspondingly for the x parquet a smooth -sinusoidal function as a function of the steps, while a step function, approximating a sine, of lower frequency results for the y parquet. The corresponding frequency spectrum is shown in FIG. 7(f). The result for the x parquet is a single frequency with the value 2, while the y signal intensity is composed of two contributions of different amplitude. Here, as well, it is possible to separate x and y directions in the Fourier space.

The same two-dimensional phase steps $\phi_x/\phi_y$ are approached in FIGS. 7(a) and 7(d). Consequently, the FIGS. 7(b) and 7(e) can be obtained from a single measurement when the measured data are permutated in the required sequence before the evaluation. Two grating directions x and y can therefore be evaluated for the same frequency, 2 in the example here, without influencing one another by crosstalk.

In accordance with the above notation for the fundamental period Λ, it is possible to permute the phase step for each direction, for example in accordance with 15*Λ/16, 13*Λ/16, 3*Λ/16 . . . etc. in accordance with the random principle, for example, until all the positions (in any desired sequence) have been approached at least once. The fundamental period can also be subdivided into more or less than 16 steps.

Figure 8:
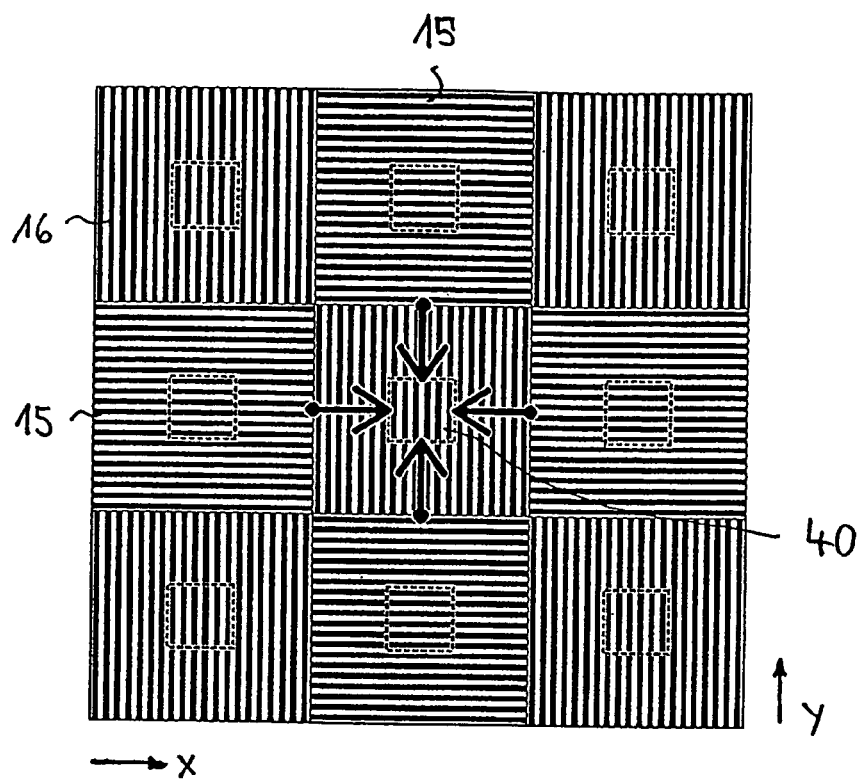
FIG. 8 shows a detail from an orthogonal parquet grating in the case of which only the middle region of each cell is used.

It has been found that the individual parquet cells influence one another mutually the less the further they are removed from one another. This decrease in crosstalk with the lateral spacing is observed independently of its cause, which can, for example, reside in the fact that the detector, for example a camera, can transmit only one specific spatial frequency, or in the fact that a grating carrier has only a limited spatial resolution. Crosstalk can be reduced when (in conjunction with directly bordering parquet cells, as in FIG. 8) the respective edge regions of the sub-gratings are not used, but only the respective middle regions 40 in the cells are evaluated. It may be seen from the arrows that in this way the spacing between the evaluation regions 40 and the crosstalk grating regions or the nearest neighboring cells is increased.

Figure 9:
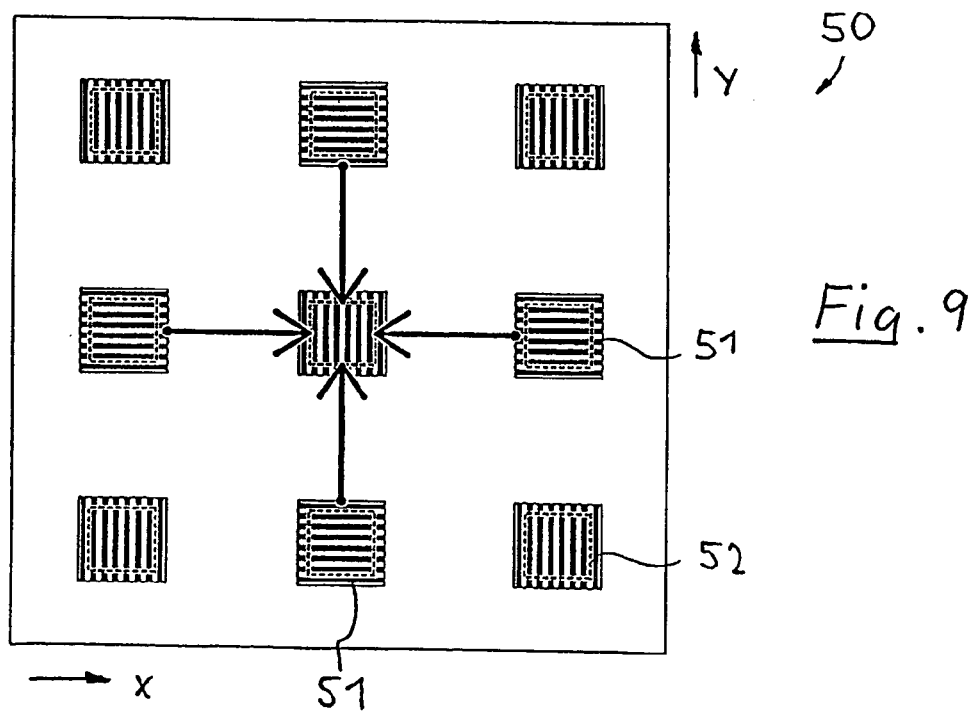
FIG. 9 shows an exemplary embodiment for parceling an orthogonal parquet grating with gaps the cells.

A particularly advantageous type of grating is described with the aid of FIG. 9. The grating 50 is distinguished in that a lateral spacing exists in the x and y directions between neighboring cells 51, 52 of different sub-grating orientation, and that gaps free from gratings exist between the cells. The width of the gaps can be of the order of magnitude of the diameter of the square cells. It can be advantageous to darken the gaps in the object grating or to fashion them opaquely, so that interfering light does not pass into the optics 2 to be measured together with beams diffracted away. It is possible, moreover, in this way to reduce heating of the lens 2 or of the gratings 3 and 4 by absorption. The gaps and edge regions in the image grating are preferably transparent. It is favorable when the image grating is provided with an antireflection coating in order to reduce reflections, which can be produced, for example, by metallic chromium, of which the grating lines can consist. A reduction in reflection is favorable, since disturbing reflections can contribute to crosstalk. Structures for other measuring techniques, for example for image quality or scattered light, can be introduced into the gap or interspaces between the cells. It is thereby possible, if appropriate, to save on an exchange of grating carriers and their adjustment.

The provision explained here of gaps (free from gratings) between cells provided with sub-gratings is denoted here as parceling.

A further possibility for suppressing crosstalk signals in the case of the use of parquet gratings is explained with the aid of FIG. 10. In a regular grating, a plurality of parquet cells of equivalent symmetry crosstalk into a single cell. For example, in an orthogonal parquet grating in accordance with FIG. 2, crosstalk takes place into a cell 16 with grating lines aligned in the y direction from the cells 15, neighboring in the x direction and y direction, of the other structural direction and, if appropriate, cells further removed. In a preferred embodiment, the result is that, owing to skilful selection of the initial phases of the sub-gratings in the individual cells, the crosstalk-modulated signals from such equivalent cells compensate one another partially or completely. The compensation is effective independently of whether the cells are the closest neighboring ones or whether they are situated further removed. For the purpose of explanation, FIG. 10(*a*) shows a parceled parquet grating 60 in which the sub-gratings of identical orientation of cells 62, 61, 62 following one another in one direction are displaced relative to one another in each case by a half grating period corresponding to a phase shift of π. The effect of the initial phase distribution on the signal of a selected cell 61' is shown in FIG. 10(*b*). Both the signals from the cells 62 directly neighboring in the x direction, and those of the cells 62 directly neighboring in the y direction have a phase shift of π. This leads to a compensation of the crosstalk fundamental waves in such a π grating.

In the case of a single π grating (FIGS. 10(*a*) and (*b*)), the fundamental waves compensate one another, but not the first harmonics, since these are affected by the built-in initial phases with 2 π. So that the crosstalk of these first harmonics is also excluded, it is possible to use an optimized grating design such as, for example, a π/2 grating (FIGS. 10(*c*) and (*d*)).

In the embodiment of a π/2 grating 70 in FIGS. 10(*c*) and (*d*), with reference to a cell 71', the cells 72, neighboring in the x direction and y direction, of the other structural direction, are phase-shifted relative to one another by π in each case. However, the cells 72 which are neighboring via a corner have a relative phase shift of π/2. The result of this is that, in addition to the crosstalk fundamental waves, the first harmonics of the signals crosstalking into a cell 71' are also compensated.

Even if the crosstalk signal amplitudes do not exactly correspond, for example because of manufacturing tolerances, or the initial phase differences are not exactly observed, the effectively active crosstalk is substantially reduced nevertheless by skilful selection of different initial phases. The phase shift is prohibited from being present in the object grating and image grating with an identical phase magnitude, since the desired effect does not otherwise occur. The phases are preferably varied only in the object grating.

It is possible not only to compensate the crosstalk of differently oriented structural directions (in the case of parquet gratings) by varying the initial phases of cells. It is also possible in this way to suppress the smoothing between grating regions aligned in parallel that reduces the spatial resolution of the measurement. Consequently, variable initial phases of the type described here by way of example are also suitable for parceled linear gratings in the case of which the sub-gratings of the individual cells have an identical grating orientation. The individual cells can be arranged with or without a lateral spacing from one another. The same holds for crossed gratings or chessboard gratings.

By contrast with conventional linear gratings, in the case of parquet gratings, object gratings and image gratings must be aligned exactly with one another. The adjustment can be carried out with the aid of the edging of parcels. Separate adjusting marks applied to the gratings are preferred in order to raise the position of the alignment, in particular with regard to scaling and torsion. Furthermore, equivalent adjusting marks that are faded into the observing system, for example into the monitor of a camera, can promote an accurate adjustment of the parquet grating pair 3, 4 relative to the detection and observing system 7. This procedure saves complicated and error-prone pattern recognition methods, since the position of the evaluation windows is uniquely fixed.

It is advantageous for the visual assessment of the moiré patterns if not only the components of the individual structural directions are separated, but if also values for the gaps between the individual cells of identical structural orientation are interpolated and varying initial phases that may be present are calculated inversely by means of suitable algorithms. Included here as gaps are the gaps that would be produced if the cells of the other structural direction were removed in each case. FIG. 11 shows by way of example for this purpose an interpolation of the intensity $\tilde{I}_0$ in the parquet cell with initial phase π onto the initial phase 0 for a π/2 grating (compare FIGS. 10(*c*), (*d*)). The interpolated intensity $\tilde{I}_0$ is calculated for this parquet cell by way of example in accordance with $$\tilde{I}_0 = \frac{1}{2}(I_{++} + I_{-+} + I_{--} + I_{+-}) - I_0.$$

The other cells are likewise calculated by means of a suitable linear combination of the neighbors with an identical structural direction.

Figure 12:
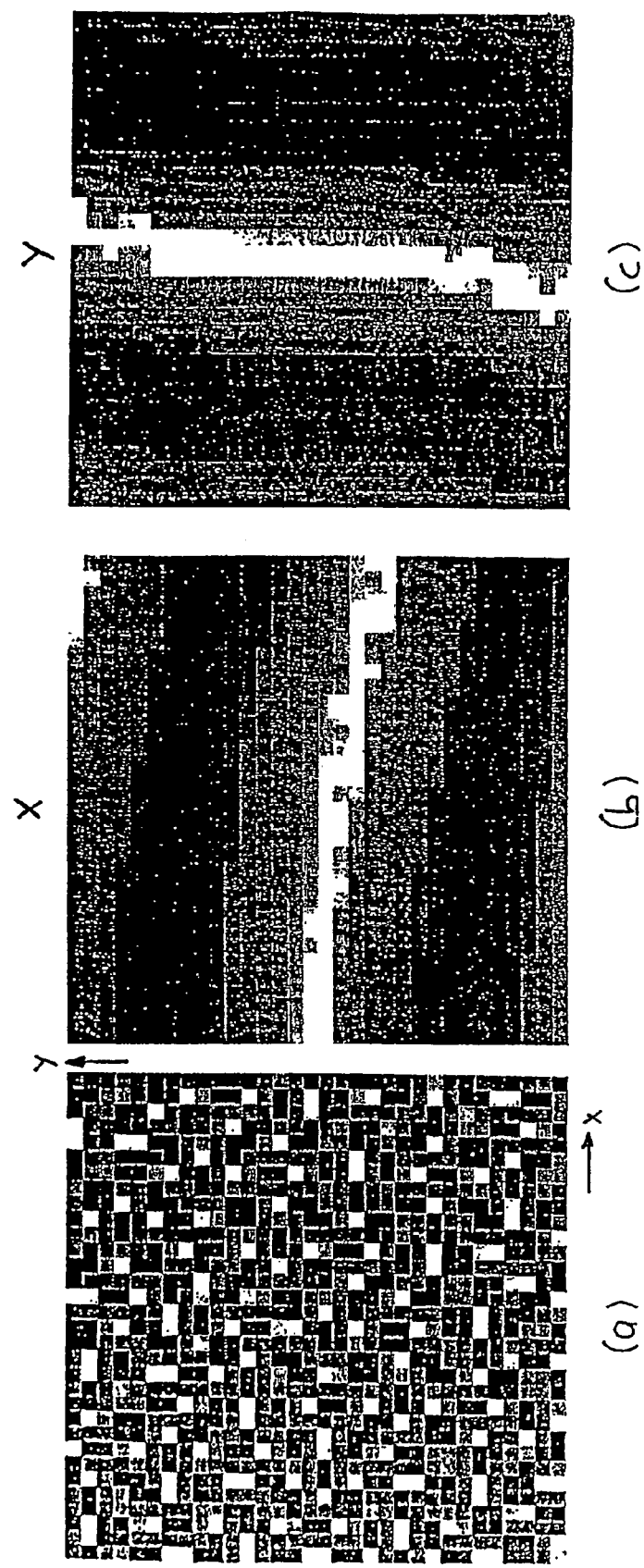
FIG. 12 shows a schematic of a reconstruction of moiré fringes of various image directions (FIG. 12(b) and (c)) from a parquet moiré pattern (FIG. 12(a)) of a π/2 grating.

An example of a reconstruction of moiré fringes familiar to an operator from a parquet moiré pattern (subdivided into cells) is illustrated in FIG. 12. For this purpose, FIG. 12(*a*) shows a parquet moiré pattern of a π/2 grating as shown by way of example in FIG. 10(*c*). The overall moiré patterns, shown in FIGS. 12(*b*) and (*c*), for the two structure orientations (parallel to the x and y direction, respectively) present in the parquet pattern are calculated therefrom and displayed on a display screen without the need to rotate the lens 2 to be measured. The reconstituted moiré patterns for the x direction (FIG. 12(*b*)) and y direction (FIG. 12(*c*)) correspond to the familiar moiré patterns of single linear gratings and can be interpreted reliably in a short time by skilled operators in order, for example, when adjusting an objective, specifically to set individual lens elements of an objective such that the total distortion of the objective is reduced. The data that can be used to display the reconstructed moiré fringes can also serve as a basis for calculating numerical representations of aberrations.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The invention claimed is:

1. Moiré method for measuring aberrations of an optical imaging system, comprising:
   arranging an object grating with an object pattern in an object plane of the imaging system;
   arranging an image grating with an image pattern in the image plane of the imaging system;
   the object pattern and the image pattern in each case having a multiplicity of cells with sub-gratings of different grating properties; and
   the object pattern and the image pattern being adapted to one another in such a way that, when the object pattern is projected onto the image pattern with the aid of the imaging system, images of the sub-gratings of the object pattern superimpose at least partly in each case with assigned sub-gratings of the image pattern, accompanied by the generation of moiré sub-patterns;

detecting the moiré sub-patterns; and evaluating the moiré sub-patterns.

2. Method according to claim 1, wherein the evaluation of the moiré sub-patterns comprises the following step:

determining a first distortion component and at least one second distortion component from the moiré sub-patterns, the first distortion component being assigned to a first image direction of the image plane, and the second distortion component being assigned to a second image direction, running transverse to the first image direction, of the image plane.

3. Method according to claim 2, wherein distortion components of at least two different image directions are determined simultaneously in the course of a measurement.

4. Moiré method according to claim 3, wherein the relative displacement is carried out in such a way that different periodicity lengths result for the alternating phase shift signals assigned to the image directions.

5. Moiré method according to claim 3, wherein the relative displacement is carried out in a temporally offset fashion firstly completely in a first displacement direction, and thereafter completely in a second displacement direction running transverse to the first displacement direction, or there is multiple alternation between the displacement directions.

6. Moiré method according to claim 3, wherein predetermined relative positions between the object pattern and image pattern in the first displacement direction and the second displacement direction are set in different sequences in order to obtain permutation of relative positions.

7. Moiré method according to claim 3, having the following steps:

performing Fourier transformation of the phase shift signal assigned to an image location, in order to determine a frequency spectrum for a first and at least one second direction of periodicity;

separating the frequency spectra of the directions of periodicity in Fourier space;

removing frequencies produced by crosstalk between the directions of periodicity, in order to generate purged frequency spectra; and determining the initial phases for various directions of periodicity from the frequency spectra.

8. Moiré method according to claim 3, having the following steps:

performing Fourier transformation of the phase shift signal assigned to an image location, in order to determine a frequency spectrum for a first and at least one second direction of periodicity;

separating the frequency spectra of the directions of periodicity in Fourier space;

removing frequencies produced by crosstalk between the directions of periodicity, in order to generate purged frequency spectra;

performing back transformation of the purged frequency spectra in order to determine purged phase shift signals; and determining initial phases for the various directions of periodicity from the purged phase shift signals obtained by back transformation.

9. Moiré method according to claim 1, comprising:

displacing the object pattern and image pattern relative to one another in at least one displacement direction, running parallel to the object plane or image plane of the imaging system, in order to generate moiré sub-patterns with different phase angles; and detecting locally the intensity of the moiré sub-patterns at at least one image location of the moiré sub-patterns in order to determine a temporally alternating phase shift signal assigned to the image location.

10. Moiré method according to claim 9, having the following steps:

determining an initial phase of the temporally alternating phase shift signal; and determining at least one distortion component on the basis of the initial phase.

11. Moiré method according to claim 9, wherein the object pattern and the image pattern in each case have a group of first cells with first subgratings of a first direction of periodicity and at least one group of second cells with second sub-gratings of a second direction of periodicity, which runs transverse to the first direction of periodicity, the relative displacement being carried out in a displacement direction which runs transverse to the first and to the second direction of periodicity.

12. Moiré method according to claim 11, wherein the relative displacement is carried out in a displacement direction which is not situated symmetrically between the directions of periodicity of the object grating and image grating.

13. Moiré method according to claim 1, wherein only regions of the cells between which a lateral spacing exists are used to produce moiré sub-patterns.

14. Moiré method according to claim 1, wherein an object pattern and/or an image pattern are/is used in which a lateral spacing exists between neighboring cells.

15. Moiré method according to claim 1, wherein an object pattern and/or an image pattern are/is used which is fashioned such that the sub-gratings of neighboring cells of identical direction of periodicity are phase-shifted relative to one another in such a way that they have different initial phases.

16. Moiré method according to claim 1, having the following steps:

interpolating an overall moiré pattern of at least one image direction from moire sub-patterns of identical orientation; and optically displaying the at least one overall moiré pattern.

17. Measuring system for measuring aberrations of an optical imaging system, with the aid of moiré patterns, the measuring system having:

an object grating, which can be arranged in the object plane of the imaging system, with an object pattern which has a multiplicity of cells with sub-gratings of different grating properties;

an image grating, which can be arranged in an image plane of the imaging system, with an image pattern which has a multiplicity of cells with sub-gratings of different grating properties;

the object pattern and the image pattern being adapted to one another in such a way that, when the object pattern is projected onto the image pattern with the aid of the imaging system, images of the sub-gratings of the object pattern superimpose in each case with assigned sub-gratings of the image pattern, accompanied by the generation of moiré sub-patterns;

devices for projecting the object pattern onto the image pattern in order to generate the moiré sub-patterns;

devices for detecting the moiré sub-patterns; and devices for evaluating the moiré sub-patterns.

18. Measuring system according to claim 17, wherein the devices for evaluating the moiré sub-patterns have a device for determining a first distortion component and at least one second distortion component from the moiré sub-patterns, the first distortion component being assigned to a first image direction and the second distortion component being assigned to a second image direction, running transverse to the first image direction, of the image plane.

19. Measuring system according to claim 18, wherein the displacement device is designed in such a way that it is possible to set a displacement direction which is aligned transverse to a first direction of periodicity and to a second direction of periodicity of the object pattern and image pattern.

20. Measuring system according to claim 18, wherein the displacement device is designed in such a way that it is possible to set a displacement direction which is situated asymmetrically between a first direction of periodicity and at least one second direction of periodicity of the object pattern and image pattern.

21. Measuring system according to claim 17, wherein a displacement device is provided for displacing the object pattern and image pattern relative to one another in a displacement direction parallel to the object plane and image plane of the measuring system.

22. Measuring system according to claim 17, wherein the object grating and the image grating have a multiplicity of cells with sub-gratings, the sub-gratings in each case being line gratings with alternately different directions of periodicity.

23. Measuring system according to claim 17, wherein the object grating and the image grating have a multiplicity of cells with sub-gratings, the sub-gratings having different grating periods.

24. Measuring system according to claim 17, wherein the object grating and the image grating have a multiplicity of cells with sub-gratings, the sub-gratings alternately having two directions of periodicity perpendicular to one another.

25. Measuring system according to claim 17, wherein the object grating and the image grating are subdivided into a multiplicity of cells with sub-gratings, sub-gratings with two, three, four or six different directions of periodicity being provided.

26. Measuring system according to claim 17, wherein at least one of the object grating and the image grating has a multiplicity of cells which are arranged to fill the surface.

27. Measuring system according to claim 17, wherein the cells have the shape of a polygon with two-,three-, four- or six-fold symmetry.

28. Measuring system according to claim 17, wherein at least one of an object pattern and an image pattern is provided in the case of which a lateral spacing exists between neighboring cells.

29. Measuring system according to claim 17, wherein at least one of an object pattern and an image pattern is provided which is fashioned such that the sub-gratings of neighboring cells of identical directions of periodicity are phase-shifted relative to one another in such a way that they have different initial phases.

30. Moiré method for measuring the distortion of an optical imaging system, comprising:
arranging an object grating with an object pattern in an object plane of the imaging system;
arranging an image grating with an image pattern in the image plane of the imaging system;
the object pattern and the image pattern in each case having a multidimensional grating with a first direction of periodicity and at least one second direction of periodicity, and
the object pattern and the image pattern being adapted to one another in such a way that, when the object pattern is projected onto the image pattern with the aid of the imaging system, an image of the object pattern is superimposed at least partially with the image pattern to form a multidimensional moiré pattern; displacing the object pattern and image pattern relative to one another in at least one displacement direction, running parallel to the object plane or image plane of the imaging system, in order to generate multidimensional moiré sub-patterns with different phase angles, the displacement direction being situated asymmetrically between the directions of periodicity of the object grating and image grating; and
detecting locally the intensity of the moiré patterns at at least one image location of the moiré patterns in order to determine a temporally alternating phase shift signal assigned to the image location.

31. Moiré method according to claim 30, comprising:
simultaneously determining a first distortion component and at least one second distortion component from the phase shift signal, the first distortion component being assigned to a first image direction of the image plane, and the second distortion component being assigned to a second image direction, running transverse to the first image direction of the image plane.

32. Moiré method according to claim 30, comprising:
determining an initial phase of the temporally alternating phase shift signal; and
determining at least one distortion component on the basis of the initial phase.

33. Moiré method according to claim 30, comprising:
performing Fourier transformation of the phase shift signal assigned to an image location, in order to determine a frequency spectrum for a first and at least one second direction of periodicity;
separating the frequency spectra of the directions of periodicity in Fourier space;
removing frequencies produced by crosstalk between the directions of periodicity, in order to generate purged frequency spectra;
performing back transformation of the purged frequency spectra in order to determine purged phase shift signals; and
determining initial phases for the various directions of periodicity from the purged phase shift signals obtained by back transformation.

* * * * *